United States Patent
Slavens et al.

(10) Patent No.: US 10,012,088 B2
(45) Date of Patent: Jul. 3, 2018

(54) ADDITIVE MANUFACTURING SYSTEM UTILIZING AN EPITAXY PROCESS AND METHOD OF OPERATION

(71) Applicant: United Technologies Corporation, Farmington, CT (US)

(72) Inventors: Thomas N. Slavens, Moodus, CT (US); Thomas J. Martin, East Hampton, CT (US); Alexander Staroselsky, Avon, CT (US); Sergey Mironets, Charlotte, NC (US); Brooks E. Snyder, Dartmouth (CA); Mark F. Zelesky, Bolton, CT (US)

(73) Assignee: United Technologies Corporation, Farmington, CT (US)

( * ) Notice: Subject to any disclaimer, the term of this patent is extended or adjusted under 35 U.S.C. 154(b) by 16 days.

(21) Appl. No.: 15/109,351

(22) PCT Filed: Jan. 15, 2015

(86) PCT No.: PCT/US2015/011617
§ 371 (c)(1),
(2) Date: Jun. 30, 2016

(87) PCT Pub. No.: WO2015/109102
PCT Pub. Date: Jul. 23, 2015

(65) Prior Publication Data
US 2016/0326880 A1    Nov. 10, 2016

Related U.S. Application Data

(60) Provisional application No. 61/929,359, filed on Jan. 20, 2014.

(51) Int. Cl.
| | | |
|---|---|---|
| *C30B 13/06* | (2006.01) | |
| *F01D 5/14* | (2006.01) | |
| *B22F 5/04* | (2006.01) | |
| *B22F 3/105* | (2006.01) | |
| *B33Y 10/00* | (2015.01) | |
| *B33Y 30/00* | (2015.01) | |
| *B33Y 40/00* | (2015.01) | |
| *B33Y 50/02* | (2015.01) | |

(Continued)

(52) U.S. Cl.
CPC ............ *F01D 5/147* (2013.01); *B22F 3/1055* (2013.01); *B22F 5/04* (2013.01); *B23K 15/0026* (2013.01);
(Continued)

(58) Field of Classification Search
CPC .......... B32B 15/02; C30B 13/16; C30B 13/28
See application file for complete search history.

(56) References Cited

U.S. PATENT DOCUMENTS

| | | |
|---|---|---|
| 2004/0200404 A1 | 10/2004 | Brice |
| 2011/0135952 A1 | 6/2011 | Morris et al. |

(Continued)

FOREIGN PATENT DOCUMENTS

| | | |
|---|---|---|
| JP | 09155980 | 6/1997 |
| JP | 03719492 | 5/2006 |
| JP | 2007021747 A | 2/2007 |

OTHER PUBLICATIONS

EP search report for EP15737461.2 dated Jan. 9, 2017.

*Primary Examiner* — Robert M Kunemund
(74) *Attorney, Agent, or Firm* — O'Shea Getz P.C.

(57) ABSTRACT

An additive manufacturing system utilizing an epitaxy process, and method of manufacture, utilizes a heating source and a cooling source to control thermal gradients and a solidification rate of each slice of a workpiece manufactured from a seed having a directional grain microstructure. An energy gun is utilized to melt selected regions of each successive layer of a plurality layers of a powder in a powder bed to successively form each solidified slice of the workpiece.

20 Claims, 4 Drawing Sheets

(51) Int. Cl.
  B23K 26/342    (2014.01)
  B23K 26/70     (2014.01)
  B23K 15/00     (2006.01)
  B23K 15/02     (2006.01)
  B23K 26/00     (2014.01)
  C30B 13/24     (2006.01)
  C30B 29/52     (2006.01)
  F01D 5/30      (2006.01)
  C30B 11/00     (2006.01)
  C30B 11/14     (2006.01)
  C30B 29/60     (2006.01)
  B23K 101/00    (2006.01)
  B23K 103/08    (2006.01)

(52) U.S. Cl.
  CPC ...... *B23K 15/0086* (2013.01); *B23K 15/0093* (2013.01); *B23K 15/02* (2013.01); *B23K 26/0006* (2013.01); *B23K 26/342* (2015.10); *B23K 26/703* (2015.10); *B33Y 10/00* (2014.12); *B33Y 30/00* (2014.12); *B33Y 40/00* (2014.12); *B33Y 50/02* (2014.12); *C30B 11/005* (2013.01); *C30B 11/006* (2013.01); *C30B 11/14* (2013.01); *C30B 13/06* (2013.01); *C30B 13/24* (2013.01); *C30B 29/52* (2013.01); *C30B 29/607* (2013.01); *F01D 5/3007* (2013.01); *B22F 2003/1056* (2013.01); *B22F 2003/1057* (2013.01); *B22F 2203/11* (2013.01); *B22F 2207/15* (2013.01); *B22F 2302/45* (2013.01); *B22F 2998/10* (2013.01); *B23K 2201/001* (2013.01); *B23K 2203/08* (2013.01); *F05D 2230/30* (2013.01); *Y02P 10/295* (2015.11)

(56) References Cited

U.S. PATENT DOCUMENTS

2011/0241240 A1   10/2011   Gothait et al.
2015/0064048 A1   3/2015    Bessac et al.
2015/0165545 A1   6/2015    Goehler et al.

ADDITIVE MANUFACTURING SYSTEM UTILIZING AN EPITAXY PROCESS AND METHOD OF OPERATION

This application claims priority to PCT Patent Application No. PCT/US15/011617 filed Jan. 15, 2015 which claims priority to U.S. Patent Application No. 61/929,359 filed Jan. 20, 2014, which are hereby incorporated herein by reference in their entireties.

BACKGROUND

The present disclosure relates to an additive manufacturing system and, more particularly, to an additive manufacturing system utilizing an epitaxy process and method of operation.

Traditional additive manufacturing systems include, for example, Additive Layer Manufacturing (ALM) devices, such as Direct Metal Laser Sintering (DMLS), Selective Laser Melting (SLM), Laser Beam Melting (LBM) and Electron Beam Melting (EBM) that provide for the fabrication of complex metal, alloy, polymer, ceramic and composite structures by the freeform construction of the workpiece, layer-by-layer. The principle behind additive manufacturing processes involves the selective melting of atomized precursor powder beds by a directed energy source, producing the lithographic build-up of the workpiece. The melting of the powder occurs in a small localized region of the energy beam, producing small volumes of melting, called melt pools, followed by rapid solidification, allowing for very precise control of the solidification process in the layer-by-layer fabrication of the workpiece. These devices are directed by three-dimensional geometry solid models developed in Computer Aided Design (CAD) software systems.

The EBM system utilizes an electron beam gun and the DMLS, SLM, and LBM systems utilize a laser as the energy source. Both system beam types are focused by a lens, then deflected by an electromagnetic scanner or rotating mirror so that the energy beam selectively impinges on a powder bed. The EBM system uses a beam of electrons accelerated by an electric potential difference and focused using electromagnetic lenses that selectively scans the powder bed. The DMLS, SLM and LBM utilize a focused laser beam scanned by a rotating mirror. The EBM technology offers higher power densities, and therefore faster scanning rates, over lasers, and is capable of processing superalloys. The powder is melted at the energy focus site on the build surface or substrate. The strategy of the scanning, power of the energy beam, residence time or speed, sequence of melting are directed by an embedded CAD system. The precursor powder is either gravitationally fed from cassettes or loaded by a piston so that it can be raked onto the build table. The excess powder is raked off and collected for re-application. Since the electron gun or laser is fixed, the build table can be lowered with each successive layer so that the workpiece is built upon the pre-solidified layer beneath.

Unfortunately, known additive manufacturing processes and systems do not apply epitaxy concepts and are not capable of manufacturing workpieces with a pre-specified, directionally solidified microstructure such as single crystal alloys.

SUMMARY

A method of additive manufacturing a workpiece according to one, non-limiting, embodiment of the present disclosure includes providing a seed for propagating grain microstructure growth, covering the seed with a plurality of layers of a powder bed of a material capable of grain structure growth, melting at least in-part each successive layer of the plurality of layers utilizing an energy gun, controlling a solidification rate of each melted successive layer utilizing a cooling source located below the layer, forming a solidified slice of the workpiece and such that a grain structure of the seed propagates through the solidified slice, and proceeding to the next successive layer.

Additionally to the foregoing embodiment, the method includes controlling a thermal gradient across each successive layer.

In the alternative or additionally thereto, in the foregoing embodiment the seed and each slice includes a build surface and the step of melting each successive layer includes melting a meltback region of the build surface.

In the alternative or additionally thereto, in the foregoing embodiment the thermal gradient is controlled at least in-part by the cooling source.

In the alternative or additionally thereto, in the foregoing embodiment the thermal gradient is controlled at least in-part by a heating source disposed above the powder bed.

In the alternative or additionally thereto, in the foregoing embodiment the thermal gradient is controlled in-part by a heating source disposed above the powder bed.

In the alternative or additionally thereto, in the foregoing embodiment the solidification rate is also controlled utilizing a heating source located above the powder bed.

In the alternative or additionally thereto, in the foregoing embodiment the solidification rate is also controlled utilizing a heating source located above the powder bed.

In the alternative or additionally thereto, in the foregoing embodiment the method further includes heating the build surface of the seed or the slice to a predetermined temperature slightly below melting temperature with a heating source and before covering the seed or the slice with the next successive layer.

In the alternative or additionally thereto, in the foregoing embodiment the build surface is heated to about one hundred degrees Fahrenheit below melting temperature.

In the alternative or additionally thereto, in the foregoing embodiment the workpiece is a turbine component.

In the alternative or additionally thereto, in the foregoing embodiment the workpiece is a turbine blade.

In the alternative or additionally thereto, in the foregoing embodiment the seed is a cast manufactured fir tree of the turbine blade and the cooling source utilizes cooling channels in the fir tree.

In the alternative or additionally thereto, in the foregoing embodiment the cooling source has cooling channels in the seed for flowing a coolant.

In the alternative or additionally thereto, in the foregoing embodiment, the method includes the further step of conditioning the build surface to a predetermined temperature that is below a melting point temperature of the material.

In the alternative or additionally thereto, in the foregoing embodiment the material is capable of directional grain structure.

In the alternative or additionally thereto, in the foregoing embodiment the material is capable of single crystal grain structure.

In the alternative or additionally thereto, in the foregoing embodiment the cooling source controls the solidification rate through thermal conduction through the seed.

An additive manufacturing system for manufacturing a workpiece in successive slices according to another, non-limiting embodiment includes a build table constructed and arranged to move vertically and support a powder bed and a seed for propagating microstructure grain growth, an energy gun for selectively melting a layer of the powder bed placed above the seed, a cooling source disposed below the layer and constructed and arranged to control at least a solidification rate of the melted layer, and a heating source disposed above the powder bed for at least controlling a temperature gradient of the melted layer.

Additionally to the foregoing embodiment, the system includes a controller, and a temperature sensor for measuring a build surface temperature of each successive slice and sending a feedback signal to the controller for control of the heating and cooling sources.

The foregoing features and elements may be combined in various combinations without exclusivity, unless expressly indicated otherwise. These features and elements as well as the operation thereof will become more apparent in-light of the following description and the accompanying drawings. It should be understood, however, the following description and figures are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

Figure 1:
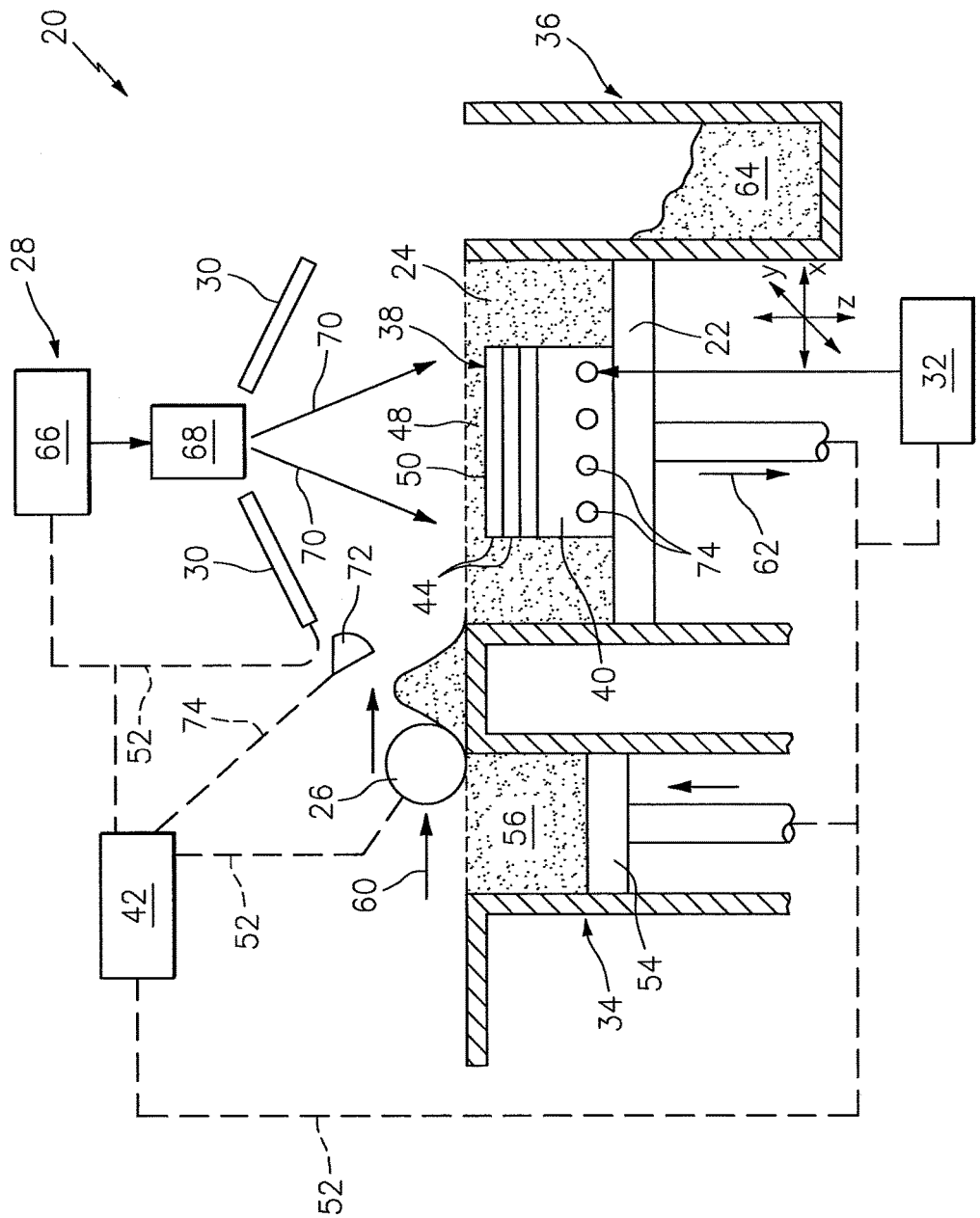
FIG. 1 is a schematic view of an additive manufacturing system according to one non-limiting embodiment of the present disclosure.

FIG. 1 schematically illustrates an additive manufacturing system 20 having a build table 22 for holding a powder bed 24, a particle spreader or wiper 26 for producing the powder bed 24, an energy gun 28 for selectively melting regions of a layer of the powder bed, multiple heating sources 30, and a cooling source 32 (with the sources controlling thermal gradients and solidification rates), a powder supply hopper 34 and a powder surplus hopper 36. The additive manufacturing system 20 is constructed to build a workpiece 38 in a layer-by-layer fashion utilizing an epitaxy process for forming directional, microstructure grains or, for example, single crystal growth in an alloy. The workpiece 38 thus includes a seed or substrate 40 with a desired directional microstructure grain.

A controller 42 may have an integral computer aided design system for modeling the workpiece 38 into a plurality of slices 44 additively built atop one-another generally in a vertical or z-coordinate direction (see arrow 46). Each solidified slice 44 corresponds to a layer 48 of the powder bed 24 prior to solidification. The layer 48 is placed on top of a build surface 50 of the previously solidified slice 44, or during initial operation, the build surface of the seed 40. The controller 42 generally operates the entire system through a series of electrical and/or digital signals 52 sent to the system 20 components. For instance, the controller 42 may send a signal 52 to a mechanical piston 54 of the supply hopper 34 to push a supply powder 56 upward for receipt by the spreader 26. The spreader 26 may be a wiper, roller or other device that pushes (see arrow 60) or places the supply powder 56 over the build surface 50 of the workpiece 38 by a pre-determined thickness established by vertical, downward, movement (see arrow 62) of the build table 22 that supports the seed 40. Any excess powder 64 may be pushed into the surplus hopper 36 by the spreader 26.

Once a substantially level powder layer 48 is established over the build surface 50, the controller 42 may send a signal to the energy gun 28 that energizes a laser or electron beam device 66 and controls a directional mechanism 68 of the gun 28. The directional mechanism 68 may include a focusing lens that focuses a beam (see arrows 70) emitted from device 66 which, in-turn may be deflected by an electromagnetic scanner or rotating mirror of the mechanism 68 so that the energy beam 70 selectively and controllably impinges upon selected regions of the top layer 48 of the powder bed 24. The beam 70 moves along the layer 48 melting region-by-region of the layer 48 at a controlled rate and power to, in-part, establish a predefined thermal gradient, generally melting each region into pools that then solidify at a controlled rate to promote the desired directional grain microstructure of the workpiece 38.

Figure 2:
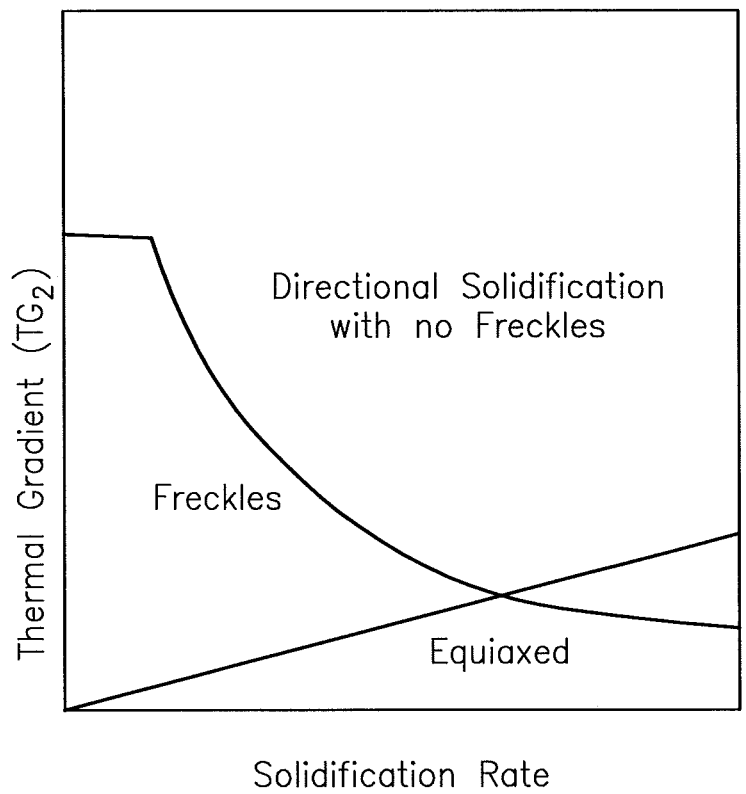
FIG. 2 is a graph of a solidification rate verse a thermal gradient of an epitaxy process.

Referring to FIG. 2, a graph of Solidification Rate verse Thermal Gradient is illustrated. The additive manufacturing system 20 operates to achieve directional solidification of the workpiece through epitaxy, and avoid freckles whether created under equiaxed conditions or not. Therefore, at a pre-established and controlled solidification rate, the system 20 also operates to maintain and control a desirable thermal gradient toward the promotion of directional grains as found in the seed 40 and as the melted powder solidifies and forms a slice 44 of the workpiece 38. More specifically, the controller 42 controls the elevated heating sources 30 that may be transiently operated (i.e. power output is adjustable) to establish the desired thermal gradient, and may be steady-state operated (i.e. power output is steady) to control the solidification rate. The controller 42 may control the heating and cooling sources 30, 32 utilizing a temperature sensor 72 that provides a feedback signal 74 indicative of the build surface temperature.

Figure 3:
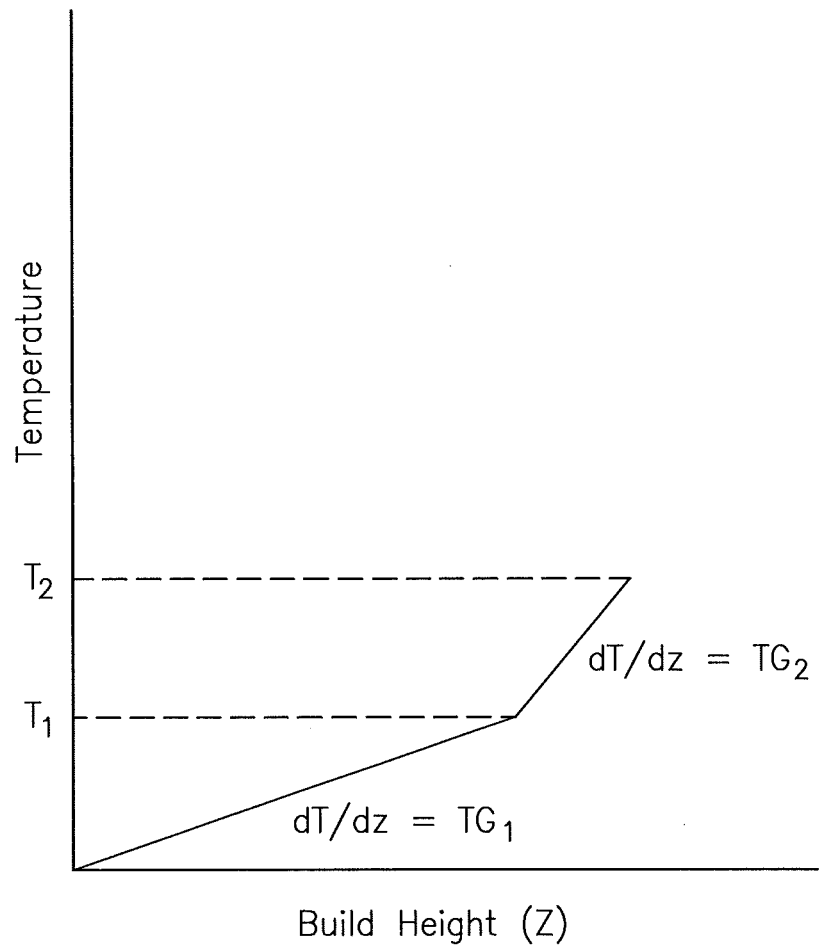
FIG. 3 is a graph of build height verse temperature for displaying directional solidification growth temperature gradients.

Referring to FIG. 3, a directional solidification growth temperature gradient graph is illustrated. A temperature gradient $TG_1$ is the change in temperature over the height of the solidified workpiece layers that are already formed through the additive manufacturing process (i.e. distance from the seed 40 to the build surface 50 of the top slice 44). Temperature gradient $TG_1$ may be primarily dictated by the desire to maintain a build surface 50 predetermined temperature $T_1$ that is below a melting point temperature of the material, and may be slightly below melting temperature, and preferably about 100 degrees Fahrenheit below the melting temperature for a material that is a nickel based superalloy. With the production of increasing height (i.e. additional solidified slices 44 beneath the build surface 50), the cooling source 32 may be the primary means to maintain temperature $T_1$, but may also operate in conjunction with the heating source 30.

At a given state or point in time, a temperature $T_2$ may be a melting temperature of the powder 56. A temperature gradient $TG_2$ is the difference in temperature $T_2$ and temperature $T_1$ divided by the height Z of the working powder layer. Since temperature $T_1$ may be held constant throughout the additive manufacturing of the next successive top slice 44, thermal gradient $TG_1$ will be constant for that slice and will be slightly lower for manufacturing of the next successive slice 44. Moreover, thermal gradient $TG_2$ will decrease over time and as the melt pool of the powder layer solidifies. That is, temperature $T_1$ is held constant and temperature $T_2$ will decrease at a controlled rate primarily through transient operation of the heating source 30. Referring further to FIG. 2, this change in temperature of temperature $T_2$ is directly related to the solidification rate. Therefore, with a given solidification rate, the range of the decreasing thermal gradient $TG_2$ during solidification should generally be found in the 'Directional Solidification with no Freckles' region of FIG. 2.

The controller 42 operates to condition and maintain the build surface temperature $T_1$ slightly below melting and preferably about 100 degrees Fahrenheit below melting for nickel based superalloys, and will control the heating and cooling sources 30, 32 accordingly. At this temperature, and for nickel based superalloys such as DSR 142 and Mar-M-247DS, with melting points ranging from about 2,400 to 2,600 degrees Fahrenheit, holding surface temperatures just below melting will relieve internal stresses created during manufacturing and assist in controlling the thermal gradient and establishing a meltback region into the build surface 50. It is further understood and contemplated that the temperature sensor 72 may be an infrared sensor or any other type of sensor capable of non-contact measurement.

With the build surface 50 at the pre-specified temperature, the next successive layer 48 of powder 56 may then be spread over the surface. When melted by the beam 70, the temperature sensor 72 is used to measure the thermal gradient across the melted pool and generally in the z-coordinate direction 62. Both the heating and cooling sources 30, 32 are utilized to maintain a desired thermal gradient. To promote directional grain growth, the heating sources 30 may be transiently operated and of an oscillating type to further control local temperature gradients at the surface of the additive build. Further, the thermal gradient is controlled in part through thermal conduction through the pre-solidified layers and the seed 40 via the cooling source 32. The cooling source 32 may controllably flow coolant such as water through a series of channels 74 in the seed 40 to thermal conduction. During fabrication of the first few slices 44 of the workpiece 38, the coolant source 32 may not be needed or may run at minimal flow. As the workpiece extends in the z-coordinate direction, through many slices, the cooling source 32 will ramp up as dictated by the controller 42 to induce further thermal conduction and maintain the desired thermal gradient.

The heating and cooling sources 30, 32 will operate similarly for controlling the solidification rate of the melted pools at a constant energy gun power, and to provide time for directional grain or single crystal growth as generally illustrated in FIG. 2. The controller 42 may apply an inverse solution method to determine optimal build parameters including adjustment of the laser gun 28 power. It is further understood and contemplated that the additive manufacturing system may include a method where fusing of powder is done by high-speed accumulation and then laser sintered (laser spray deposition); or, a method that utilizes materials that are capable of equiax grain properties, materials capable of directional solidified (DS) grain structure, or materials capable of single crystal (SX) grain structure.

Figure 4:
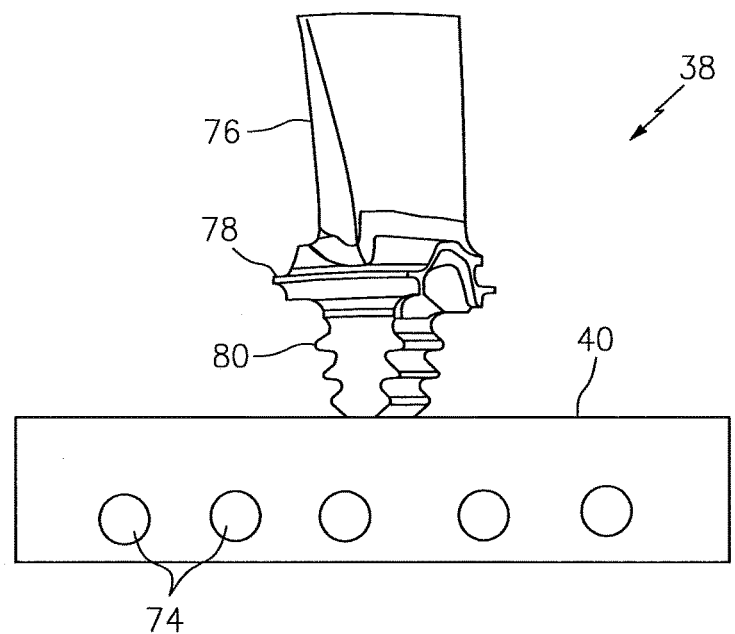
FIG. 4 is schematic view of a workpiece and seed manufactured by the additive manufacturing system.

Referring to FIG. 4, one non-limiting example of the workpiece 38 is a gas turbine engine blade having an airfoil 76 projecting outward from a platform 78 and a fir tree 80 projecting outward from the platform in an opposite direction. In this example, the fir tree 80 is attached to the seed 40 during fabrication. The seed 40 and thus the directional single crystal growth is generally in the z-coordinate direction (i.e. vertical). The seed 40 is removed after the additive manufacturing process is complete. It is further understood and contemplated that any other turbine component, where single crystal growth is desirable, may be the workpiece including complex and intricate turbine vanes.

Figure 5:
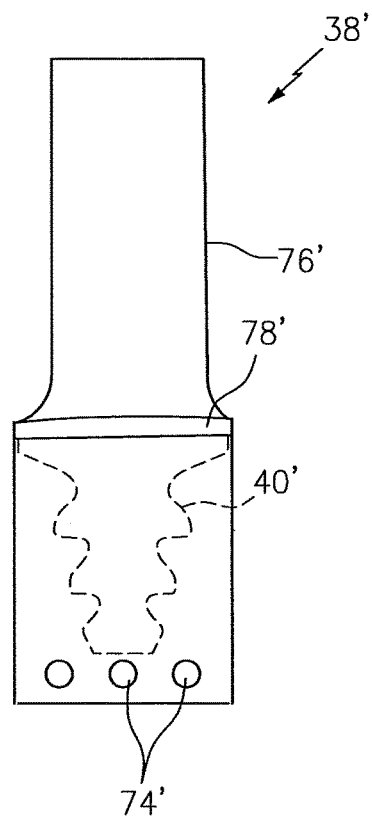
FIG. 5 is a schematic view of a second, non-limiting, embodiment of the workpiece and seed.

Referring to FIG. 5, a second non-limiting example of the present disclosure is illustrated wherein like elements have like identifying numerals except with the addition of a prim symbol. In this example, the seed 40' is the fir tree of the blade or workpiece 38'. The typical cooling channels of the fir tree 80' are used and applied as the cooling channels 74' of the seed. Moreover, and to reduce manufacturing costs, the more simple structure of the fir tree 80' may be cast as a single crystal structure and the remainder of the blade may be manufactured utilizing the additive manufacturing system. It is further contemplated and understood that the platform 78' of the blade may be cast along with the fir tree 80' at an optimum grain structure orientation. Furthermore, platforms of vanes may also be cast with optimum grain structure and then with the airfoil being additively manufactured onto the platform.

It is understood that relative positional terms such as "forward," "aft," "upper," "lower," "above," "below," and the like are with reference to the normal operational attitude and should not be considered otherwise limiting. It is also understood that like reference numerals identify corresponding or similar elements throughout the several drawings. It should be understood that although a particular component arrangement is disclosed in the illustrated embodiment, other arrangements will also benefit. Although particular step sequences may be shown, described, and claimed, it is understood that steps may be performed in any order, separated or combined unless otherwise indicated and will still benefit from the present disclosure.

The foregoing description is exemplary rather than defined by the limitations described. Various non-limiting embodiments are disclosed; however, one of ordinary skill in the art would recognize that various modifications and variations in light of the above teachings will fall within the scope of the appended claims. It is therefore understood that within the scope of the appended claims, the disclosure may be practiced other than as specifically described. For this reason, the appended claims should be studied to determine true scope and content.

What is claimed is:

1. A method of additive manufacturing a workpiece comprising the steps of:
   providing a seed for propagating grain microstructure growth;
   covering the seed with a plurality of layers of a powder bed of a material capable of grain structure growth;
   melting at least in-part each successive layer of the plurality of layers utilizing an energy gun;
   controlling a solidification rate of each melted successive layer utilizing a cooling source located below the layer;
   forming a solidified slice of the workpiece such that a grain structure of the seed propagates through the solidified slice; and
   proceeding to the next successive layer.

2. The method set forth in claim 1 comprising the further step of:

controlling a thermal gradient across each successive layer.

3. The method set forth in claim 1 wherein the seed and each slice includes a build surface and the step of melting each successive layer includes melting a meltback region of the build surface.

4. The method set forth in claim 2 wherein the thermal gradient is controlled at least in-part by the cooling source.

5. The method set forth in claim 2 wherein the thermal gradient is controlled at least in-part by a heating source disposed above the powder bed.

6. The method set forth in claim 4 wherein the thermal gradient is controlled in-part by a heating source disposed above the powder bed and the solidification rate is also controlled utilizing a heating source located above the power bed.

7. The method set forth in claim 1 wherein the solidification rate is also controlled utilizing a heating source located above the powder bed.

8. The method set forth in claim 3 comprising the further step of:
heating the build surface of the seed or the slice to a predetermined temperature slightly below melting temperature with a heating source and before covering the seed or the slice with the next successive layer.

9. The method set forth in claim 1 wherein the workpiece is a turbine component.

10. The method set forth in claim 9 wherein the workpiece is a turbine blade.

11. The method set forth in claim 10 wherein the seed is a cast manufactured fir tree of the turbine blade and the cooling source utilizes cooling channels in the fir tree.

12. The method set forth in claim 1 wherein the cooling source has cooling channels in the seed for flowing a coolant.

13. The method set forth in claim 3 comprising the further step of:
conditioning the build surface to a predetermined temperature that is below a melting point temperature of the material.

14. The method set forth in claim 1 wherein the material is capable of directional grain structure.

15. The method set forth in claim 1 wherein the material is capable of single crystal grain structure.

16. The method set forth in claim 1 wherein the cooling source controls the solidification rate through thermal conduction through the seed.

17. An additive manufacturing system for manufacturing a workpiece in successive slices, the system comprising:
a build table constructed and arranged to move vertically and support a powder bed and a seed for propagating microstructure grain growth;
an energy gun for selectively melting a layer of the powder bed placed above the seed;
a cooling source disposed below the layer and constructed and arranged to control at least a solidification rate of the melted layer; and
a heating source disposed above the powder bed for at least controlling a temperature gradient of the melted layer.

18. The additive manufacturing system set forth in claim 17 further comprising:
a controller; and
a temperature sensor for measuring a build surface temperature of each successive slice and sending a feedback signal to the controller for control of the heating and cooling sources.

19. The additive manufacturing system set forth in claim 17, wherein the heating source is transiently operated, the system further comprising:
a controller that controls the beating source to adjust a power output of the heating source to control the temperature gradient.

20. The additive manufacturing system set forth in claim 19, wherein the heating source is of an oscillating type.

* * * * *

UNITED STATES PATENT AND TRADEMARK OFFICE
CERTIFICATE OF CORRECTION

PATENT NO. : 10,012,088 B2
APPLICATION NO. : 15/109351
DATED : July 3, 2018
INVENTOR(S) : Slavens et al.

Page 1 of 1

It is certified that error appears in the above-identified patent and that said Letters Patent is hereby corrected as shown below:

In the Claims

Column 7, Line 16, please delete "power" and insert --powder--.

Column 8, Line 33, please delete "beating" and insert --heating--.

Signed and Sealed this
Twenty-eighth Day of May, 2019

Andrei Iancu
*Director of the United States Patent and Trademark Office*